United States Patent [19]
Okayasu

[11] Patent Number: 6,114,898
[45] Date of Patent: Sep. 5, 2000

[54] METHOD OF SIGNAL TRANSMISSION BETWEEN SEMICONDUCTOR INTEGRATED CIRCUITS AND OUTPUT DRIVE CIRCUIT FOR USE THEREWITH

[75] Inventor: Toshiyuki Okayasu, Saitama, Japan

[73] Assignee: Advantest Corporation, Tokyo, Japan

[21] Appl. No.: 09/056,180

[22] Filed: Apr. 6, 1998

[30] Foreign Application Priority Data

Apr. 8, 1997 [JP] Japan .................................. 9-089411

[51] Int. Cl.$^7$ .................................................. H03K 17/687
[52] U.S. Cl. ........................ 327/437; 327/112; 327/319; 326/30
[58] Field of Search .................................... 327/306, 319, 327/110, 427, 437, 530, 321, 315; 326/30, 86, 90

[56] References Cited

U.S. PATENT DOCUMENTS 5,296,756  3/1994  Patel et al. ............................ 327/108
5,544,197  8/1996  Baumgaertner et al. ............... 375/257

Primary Examiner—Dinh T. Le
Attorney, Agent, or Firm—Gallagher & Lathrop; Timothy J. Lane

[57] ABSTRACT

An output drive circuit within a semiconductor integrated circuit is formed into a push-pull configuration by field effect transistors, the bias of which is controlled to establish the output impedance of the driver at a desired value.

21 Claims, 5 Drawing Sheets

METHOD OF SIGNAL TRANSMISSION BETWEEN SEMICONDUCTOR INTEGRATED CIRCUITS AND OUTPUT DRIVE CIRCUIT FOR USE THEREWITH

BACKGROUND OF THE INVENTION

The invention relates to a signal transmission method of transmitting and receiving high rate signals between semiconductor integrated circuits, for example, and an output drive circuit for use therewith.

A multiplicity of semiconductor integrated circuits mounted on a circuit substrate are electrically interconnected together for practical use through a printed circuit formed on the circuit substrate in the art.

For transmission with preserved fidelity of signal waveforms as the signal being dealt with increases its frequency, there is a need that an associated signal transmission path has an evenly matched impedance. At this end, the signal transmission line generally comprises a microstrip line so that the transmission line is matched to a given characteristic impedance. It is also recognized as another requirement for achieving a transmission without a disruption of signal waveforms that a termination resistor having a resistance equal to the characteristic impedance of the signal transmission line be connected to either one, preferably both, of a receiving and a transmitting end in order to prevent a reflection from occurring at either end.

FIG. 7 shows an example where a balanced signal is transmitted from a driver DR of a semiconductor integrated circuit $LSI_1$ to a receiving side semiconductor integrated circuit $LSI_2$ through a balanced signal transmission path LIN, which is matched to a given characteristic of impedance $Z_0$, and a termination resistor RT equal to the characteristic impedance $Z_0$ is connected to the receiving end at the receiving semiconductor integrated circuit $LSI_2$.

FIG. 8 shows another example in which the termination resistor RT is connected to the transmitting end. The fact that the connection of the termination resistor RT equal to the characteristic impedance $Z_0$ of the signal transmission path LIN to either receiving or transmitting end allows a distortion in the received signal waveform which might result from reflections to be blocked is well known in the art, but for purpose of subsequent discussions, the basis therefor will be described briefly.

When the termination resistor RT is connected to the receiving end as shown in FIG. 7, the transmitted signal is absorbed by the termination resistor RT at the receiving end, producing no reflection. Accordingly, the received signal can be accepted by the receiving side free from any influence of reflections.

On the other hand, when the termination resistor RT is connected to the transmitting end, the transmitted signal is reflected by the receiving end and then travels reversely along the signal transmission path. Since the reflected wave is arithmetically added to the received signal, the amplitude of the received signal will be approximately doubled. However, there occurs no distortion in the waveform because the signals accepted at the receiving end are of the same timing. As the reflected wave travels backward on the signal transmission path LIN, it passes by the signal directed toward the receiving end, but does not impart any distortion to the latter, whereby the latter signal is transmitted to the receiving end while maintaining its proper waveform (even though the waveform may appear distorted as a result of a sum of signals which pass by each other if it is observed at a given point on the signal transmission path LIN). When the reflected wave returns to the transmitting end, it is absorbed by the termination resistor RT at the transmitting end to disappear.

It will be understood from the preceding description that the connection of the termination resistor RT to either the receiving or the transmitting end allows the influence of reflections to be eliminated and allows the transmission with no distortion in the waveform. It will be readily apparent that the termination resistor RT will be preferably connected to both the transmitting and the receiving end to eliminate the influence of reflections more completely.

It is essential to blocking signal reflections that the termination resistor RT be connected to either one or both of the receiving and the transmitting end. It is necessary that the resistance of the termination resistor RT exactly matches the characteristic impedance $Z_0$ of the signal transmission path LIN. Accordingly, a high accuracy is required of the resistor being formed. It will thus be seen that it is not advisable to form the termination resistor RT within either semiconductor integrated circuit $LSI_1$ or $LSI_2$ since this leads to a cost increase disadvantageously. The termination resistor RT is commonly mounted outside the semiconductor integrated circuit $LSI_1$ or $LSI_2$. However, as the number of signal transmission paths LIN between the semiconductor integrated circuits $LSI_1$ and $LSI_2$ increases, the number of termination resistors RT required also increases, requiring an increased area for their mounting and presenting a difficulty to the achievement of a reduced size and a higher density of devices. The problem is even more remarkable when employing the super-high density mounting technique such as MCM (multi-chip-module), CSP (chip-size-package) or the like.

SUMMARY OF THE INVENTION

It is an object of the invention to provide a method of signal transmission between semiconductor integrated circuits which dispenses with the need for termination resistors and an output drive circuit for use therewith.

In a signal transmission method according to the invention in which signals are transmitted and received between semiconductor integrated circuits, a transmitting side semiconductor integrated circuit and a receiving side semiconductor circuit are interconnected through a signal transmission path having a given characteristic impedance and a signal is transmitted through the signal transmission path from an output drive circuit which is provided in the transmitting side semiconductor integrated circuit, and which has an output impedance substantially equal to the characteristic impedance of the signal transmission path.

With the signal transmission method according to the invention, the output impedance of the output drive circuit on the transmitting side matches the characteristic impedance of the signal transmission path, and accordingly, even though the transmitted signal is reflected at the receiving end, when the reflected wave returns to the transmitting end, it is absorbed by the output drive circuit connected to the transmitting end to disappear.

Thus, in accordance with the invention, any influence of reflections can be eliminated without the provision of any termination resistor at either receiving or transmitting end of the signal transmission path. Since there is no need to provide circuits other than the semiconductor integrated circuits, the mounting density on the printed circuit board on which the semiconductor integrated circuits are mounted can be enhanced. An advantage also accrues that a reduction in the size of a device can be realized.

The invention also provides an output drive circuit which enables a free choice of an output impedance on the transmitting side.

An output drive circuit according to the invention comprises at least one driver and a bias generator for generating a first and a second bias voltage for the driver, the driver including a pair of first field effect transistors of opposite conductivity types having their sources connected together at a junction leading to an output terminal and operating as source followers which operate in a push-pull mode, a pair of second field effect transistors of opposite conductivity types having their sources connected to the gates of the first field effect transistors, respectively, and having their gates connected together and connected to a signal input terminal and operating as source followers which drive the gates of the first field effect transistors, a pair of third field effect transistors of opposite conductivity types operating as current sources which feed current to the sources of the second field effect transistors, the amount of current fed being controlled in accordance with a bias voltage applied to each gate of the third field effect transistors to thereby control an impedance as seen from the output terminal and an offset voltage at the output terminal, and a pair of bias terminals connected to the gates of the pair of third field effect transistors, the first and the second bias voltage from the bias generator being applied to the pair of bias terminals of said at least one driver.

With the output drive circuit according to the invention, the bias voltages from the bias generator can be applied to the gates of the third field effect transistors, thus controlling the gate-source voltage of each of the pair of first field effect transistors and thus controlling the mutual conductance thereof. Since the output impedance is the reciprocal of the sum of the two mutual conductances, its value may be made equal to the characteristic impedance of a signal transmission path. In this manner, any reflected wave can be absorbed by the driver with no termination resistor connected to the signal transmission path, affording an advantage that multi-channel signal transmission paths can be formed on a reduced mounting area.

In the output drive circuit, the bias generator may comprise an impedance controlling dummy circuit constructed in the similar manner as the driver and having an input terminal to which a reference potential is applied, a multi-bridge circuit connected between the output terminal of the dummy circuit and a given point where a given supply voltage is applied and formed by four resistors inclusive of an output impedance of the dummy circuit, a first differential amplifier for detecting a potential difference between two nodes of the bridge circuit, and a feedback circuit for feeding a detection output voltage from the first differential amplifier to one of the pair of bias terminals of the dummy circuit and feeding it, after reversal of the polarity, to the other bias terminal to control the output impedance of the impedance controlling dummy circuit so that a difference between the potential difference produced in the bridge circuit and the reference potential becomes equal to zero.

In addition, the bias generator of the output drive circuit may comprise an offset controlling dummy circuit constructed in the similar manner as the driver and having an input terminal to which a reference potential is applied, a potential supply for applying a potential contained in a range of exciting potentials appearing at the output terminal of the driver to the input terminal of the offset controlling dummy circuit, a second differential amplifier for determining a bias between the potential applied from the potential supply and a potential delivered from the output terminal of the offset controlling dummy circuit, an offset adder providing a given offset voltage to either one of two potentials which are input to the second differential amplifier, and a feedback circuit for applying a feedback voltage to a bias terminal of the offset controlling dummy circuit so that the offset voltage which is added by the offset adder appears between the input terminal and the output terminal of the driver.

DETAILED DESCRIPTION OF THE PREFERRED EMBODIMENTS

Figure 1:
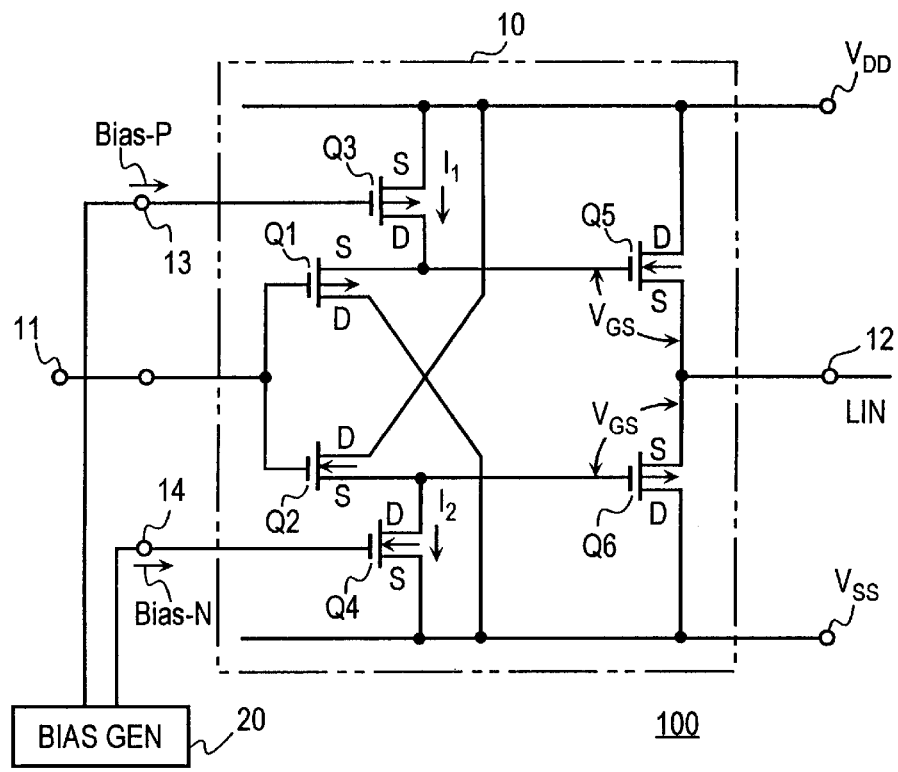
FIG. 1 is a schematic diagram for illustrating an example of an output drive circuit which may be used in the signal transmission method according to the invention.

FIG. 1 shows an output drive circuit 100 according to an embodiment of the invention including a driver 10 and a bias generator 20. The driver 10 comprises N conductivity type field effect transistors Q2, Q4, Q5 and P conductivity type field effect transistors Q1, Q3, Q6. The field effect transistors Q5 and Q6 are of opposite conductivity types, and operate as first field effect transistors having their sources S connected together and connected in series between a pair of points to which supply voltages $V_{DD}$ and $V_{SS}$ are applied. The first field effect transistors Q5, Q6 operate in a push-pull mode in response to a signal which is input to an input terminal 11 for exciting an output terminal 12 which is connected to the junction between their sources between the supply voltage $V_{DD}$, which may be +3 to 5V, for example, and $V_{SS}$, which may be 0V, for example.

Field effect transistors Q1 and Q2 of opposite conductivity types and operating as second field effect transistors have their sources S connected to the respective gates of the first field effect transistors Q5, Q6, respectively. The gates of the second field effect transistors Q1 and Q2 are connected together, and the junction therebetween is connected to the input terminal 11. The drain D of the field effect transistor Q1 is connected to the point where the supply voltage $V_{SS}$ is applied. The drain D of the field effect transistor Q2 is connected to the point where supply voltage $V_{DD}$ is applied. In this manner, the field effect transistors Q1 and Q2 operate as source followers transmitting signals of the same phase as the signal input to the input terminal 11 to the gates of the first field effect transistors Q5 and Q6.

Third field effect transistors Q3 and Q4 are connected between the respective sources S of the second field effect transistors Q1 and Q2 and the points where the supply voltages $V_{DD}$ and $V_{SS}$ are applied. The third field effect transistors Q3 and Q4 each operate as a current source circuit which is responsive to bias voltages Bias-P and Bias-N which are input to bias terminals 13 and 14 to control currents $I_1$ and $I_2$ which in turn control the gate bias of the first field effect transistors Q5 and Q6.

In other words, the gate bias voltages $V_{GS}$ of the first field effect transistors Q5 and Q6 are established to appropriate values by using the bias voltages Bias-P and Bias-N, thereby controlling the mutual conductances $g_{m1}$ and $g_{m2}$ of the first field effect transistors Q5 and Q6 and hence the output impedance.

Figure 2:
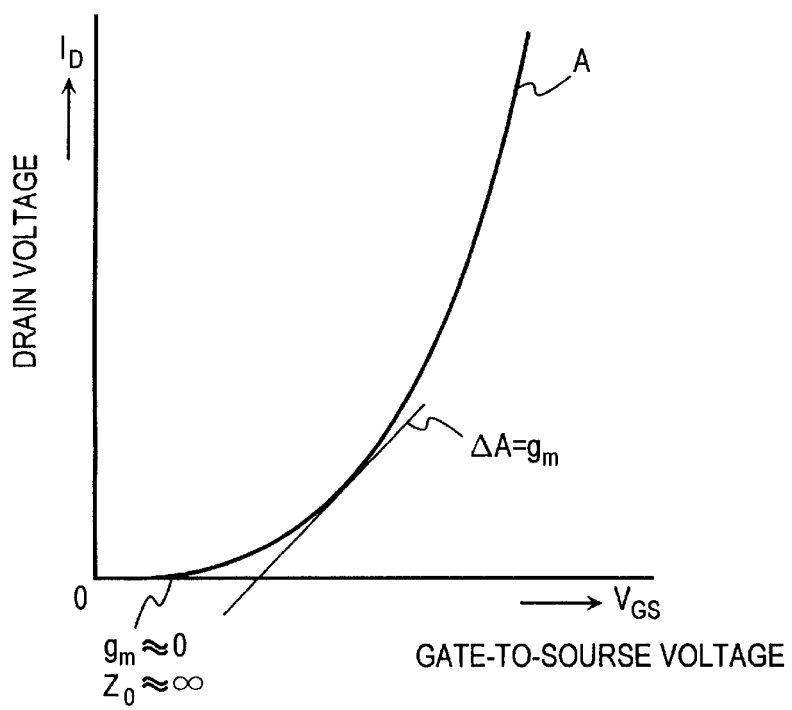
FIG. 2 graphically shows an example of an operating characteristic of a field effect transistor for illustrating the operation of the drive circuit shown in FIG. 1.

A curve A shown in FIG. 2 indicates a gate-source voltage $V_{GS}$ versus drain current $I_D$ of a usual field effect transistor, illustrating a change occurring in the impedance across the drain and the source as a bias voltage applied across the gate and the source of field effect transistor is changed. It will be seen that as the bias voltage $V_{GS}$ applied across the gate and the source is increased in the forward direction, the gradient ΔA of the curve A increases. The gradient ΔA corresponds to the mutual conductance $g_m$ of the field effect transistor. Thus, the curve A indicates that the mutual conductance $g_m$ increases as the bias voltage $V_{GS}$ increases in the forward direction.

The impedance $Z_0$ seen into the driver 10 from the output terminal 12 thereof can be represented as $Z_0=1/(g_{m1}+g_{m2})$. It then follows that by changing the gate bias voltage $V_{GS}$ applied to the first field effect transistors Q5 and Q6, the output impedance $Z_0$ can be changed. The bias generator 20 generates predetermined bias voltages Bias-P and Bias-N chosen such that the impedance as seen from the output terminal 12 into the driver 10 matches the characteristic impedance of the signal transmission path LIN, and apply such bias voltages to the terminals 13 and 14, respectively. Consequently, with the embodiment of the invention shown in FIG. 1, there can be provided the driver 10 having an output impedance which matches the characteristic impedance of the signal transmission path LIN without the provision of an impedance matching resistor at the output terminal 12 of the driver 10.

Figure 3:
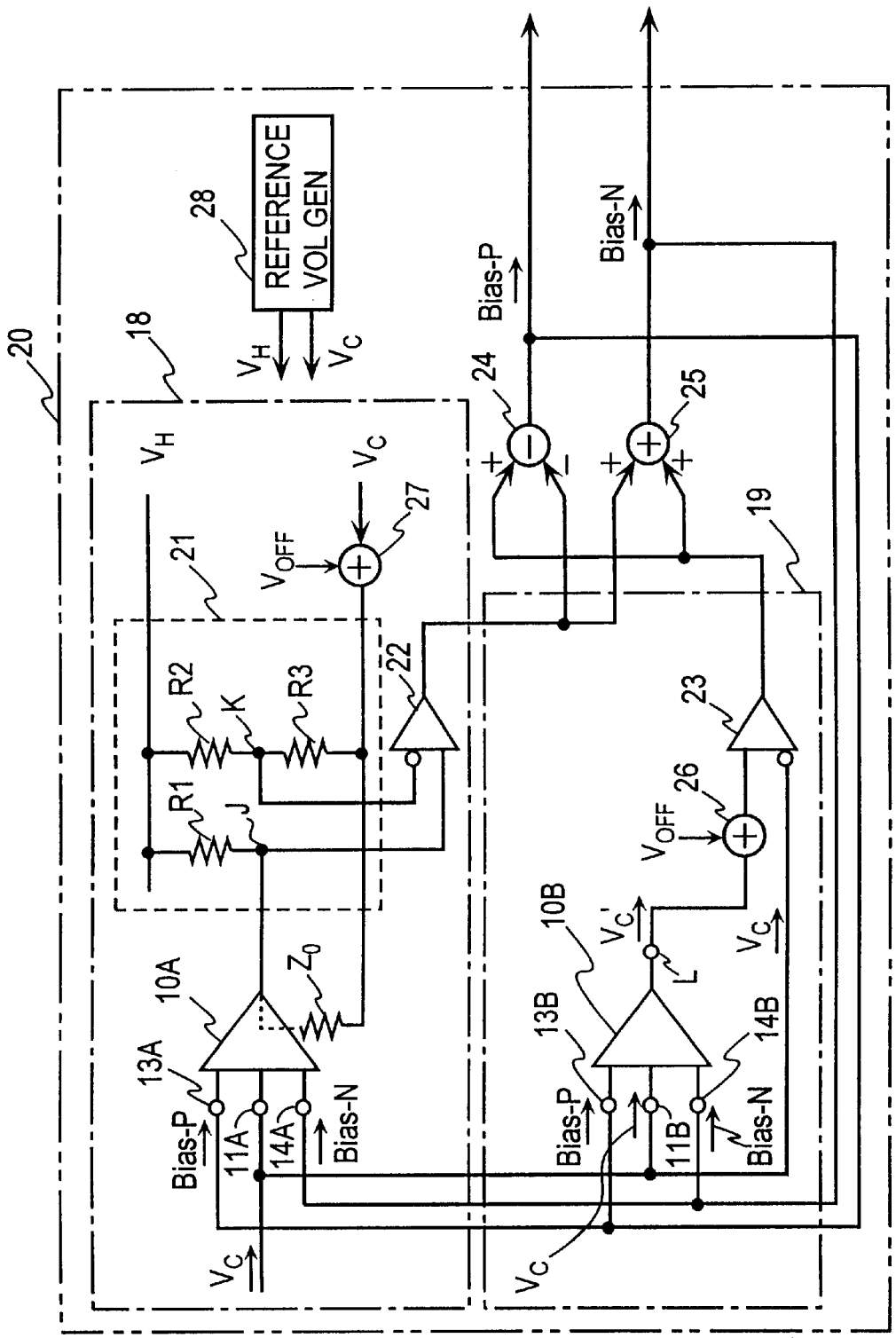
FIG. 3 is a circuit diagram showing the construction of a bias generator used in the embodiment shown in FIG. 1.

It is recognized that the response of the field effect transistor is slightly different between P-type and N-type. It is also recognized as a common occurrence that the responses of the field effect transistors forming a driver vary from wafer to wafer although the responses of the field effect transistors formed on a common wafer and forming an LSI driver are substantially aligned with each other. Accordingly, if bias voltages Bias-P and Bias-N which provide a desired output impedance are determined on the basis of typical responses which are previously determined for several field effect transistors for use in the embodiment in FIG. 1, the actual output impedance of the driver 10 cannot always provide a desired accuracy for all of LSI's available from a mass production. To accommodate for this, an embodiment for bias voltage generator 20 which is capable of establishing a desired output impedance of the driver 10 with a high accuracy without being influenced by the responses of the field effect transistors used is shown in FIG. 3. The principle takes advantage of the fact that the responses of the field effect transistors of the same conductivity type which are formed in the common LSI are substantially aligned with each other, by providing a feedback of a bias voltage to a dummy driver circuit so that its output impedance achieves a desired value and using the bias voltage thus determined to control the operating voltage of the field effect transistors which constitute the driver.

In the arrangement of the bias voltage generator 20 shown in FIG. 3, the bias voltages Bias-P and Bias-N which are applied to the third field effect transistors Q3 and Q4 shown in FIG. 1 include a first bias voltage component for impedance control which changes differentially between the both bias voltages, and a second bias voltage component which changes in the same direction for the both bias voltages to enable a control that a desired offset voltage be applied to the d.c. potential at the output terminal 12. More specifically, the bias voltage component for impedance control is changed such that when the bias voltage Bias-P applied to the bias terminal 13 moves toward $V_{SS}$, the bias voltage Bias-N applied to the other bias terminal 14 moves toward $V_{DD}$. By establishing the bias voltages Bias-P and Bias-N at desired values, the output impedance $Z_0$ of the driver 10 as seen from the output terminal 12 can be established at the desired value or the characteristic impedance of the signal transmission path connected to the output terminal 12. In addition, by controlling the second bias voltage component which biases both bias voltages Bias-P and Bias-N in the same direction, the offset voltage or the center voltage across the range of exciting voltage at the output terminal 12 of the driver 10 can be established at a desired voltage between the supply voltages $V_{DD}$ and $V_{SS}$. This allows the range of exciting voltage of the driver 10 to conform to a range of voltage which can be received on the receiving side, as determined by the circuit design.

As discussed above, the output impedance of the driver 10 can be established to any desired value by utilizing the bias voltages Bias-P and Bias-N applied to the bias terminals 13 and 14. Accordingly, by choosing the output impedance $Z_0$ of the driver 10 to coincide with the characteristic impedance of $Z_0$ of the signal transmission path LIN, it is possible to enable the waveform of the transmitted signal to be received on the receiving side with good fidelity without connecting any termination resistor to either transmitting or receiving end of the signal transmission path LIN as indicated in FIG. 1.

The arrangement of the bias generator 20 which generates bias voltages Bias-P and Bias-N to be applied to the driver 10 will now be specifically described. In the description to follow, a high level voltage delivered to the output terminal 12 of the driver 10 is denoted by $V_H$, and similarly a low level voltage is denoted by $V_L$. These voltages $V_H$, $V_L$ are chosen to be lower than the supply voltage $V_{DD}$ and higher than the supply voltage $V_{SS}$. The bias generator 20 comprises a first bias generator circuit 18 which operates to generate a bias voltage which brings the output impedance $Z_0$ of the driver 10 into coincidence with a particular impedance, and a second bias generator circuit 19 which generates an offset voltage to be applied to the output terminal 12 of the driver 10. The both generator circuits are formed on the same IC chip as the driver 10. One of the first and the second generator circuit 18, 19 may be omitted depending on the condition of the signal transmission path LIN or the condition of the receiving side, but the bias generator 20 comprising both the first bias generator circuit 18 and the second bias generator circuit 19 will be described here.

The first bias generator circuit 18 comprises a dummy circuit 10A constructed in the same manner as the driver 10, a bridge circuit 21 and a differential amplifier 22. An output terminal of the dummy circuit 10A is connected through a load resistor R1 to a point where a voltage $V_H$ is applied. A series circuit of resistors R2 and R3, which also form the bridge circuit 21, is connected between points where the voltage $V_H$ and the center voltage $V_C(=(V_H+V_L)/2)$ are applied. As mentioned previously, the voltages $V_H$ and $V_L$ are within a range between the supply voltages $V_{DD}$(3 to 5V) and $V_{SS}$ (0V), and is previously determined to lie in a voltage range from several hundreds of mV to 1V. The bridge circuit 21 comprises the load resistor R1, the output impedance $Z_0$ of the dummy circuit 10A and the resistors R2, R3. A potential at the junction between the resistors R2 and R3 is chosen as a reference potential, which is input to the differential amplifier 22 together with a voltage developed across the load resistor R1. When the resistance of the resistors R2 and R3 is chosen such that R2=R3, the bridge circuit 21 reaches a balanced condition when the load resistor R1 and output impedance $Z_0$ satisfies the relationship R1=$Z_0$, whereupon the potential difference between the potential developed across the load resistor R1 and the reference potential (namely, potential at point K) becomes equal to 0 volt.

More specifically, the center voltage V[<i]nfC between the voltages $V_H$ and $V_L$ is applied to the input terminal 11A of the dummy circuit 10A. When the reference resistor R1 is not connected to the output terminal J of the dummy circuit 10A, the potential at the output terminal of the dummy circuit 10A is equal to the center voltage $V_C$. In the embodiment shown in FIG. 3 it is assumed that the center voltage $V_C$ applied to the input terminal 11A of the dummy circuit 10A and the input terminal 11B of a dummy circuit 10B as well as to the bridge circuit 21 is generated together with the voltage $V_H$ accurately and in a stable manner by a reference voltage generator 28.

The output terminal of the dummy circuit 10A (which should assume the center voltage $V_C$) is connected through the load resistor R1 to the point having the voltage $V_H$, and the potential at the output terminal J and the potential at the junction between the resistors R2 and R3 are compared against each other in the differential amplifier 22, the output of which is fed back to the bias terminals 13A and 14A of the dummy circuit 10A through a subtractor 24 and an adder 25, thereby converging to a condition in which the potentials at points J and K are balanced.

When the convergence is reached, the potential at the point J is controlled to a condition in which it is equal to the potential at junction K between the resistors R2 and R3 or R1 is equal to $Z_0$. If the potential at the point J tends to change toward the voltage $V_H$ under this condition, this causes the potential at the output from the differential amplifier 22 to change in a direction to raise the potential. Such change in the potential causes the bias voltage Bias-P to change in a direction to reduce it while causing the bias voltage Bias-N to change in a direction to raise it.

When the bias voltage Bias-P is controlled in a direction to decrease while the bias voltage Bias-N is controlled in a direction to increase, the currents $I_1$ and $I_2$ which pass through the third field effect transistors Q3 and Q4 of the dummy circuit 10A (refer the driver 10) are controlled in a direction to increase. Consequently, the gate bias $V_{GS}$ of the first field effect transistors Q5 and Q6 increases in the forward direction. This causes the impedance of the first field effect transistors Q5 and Q6 or output impedance $Z_0$ to be controlled in a direction to decrease, whereby the potential at the point J falls, converging to the potential at the point K.

When the potential at the point J falls below the potential at the point K, the bias voltage Bias-P changes in a direction to increase while the bias voltage Bias-N changes in a direction to decrease. Accordingly, when these bias voltages are fed back to the bias terminals 13A and 14A of the dummy circuit 10A, the current $I_1$ and $I_2$ passing through the field effect transistors Q3 and Q4 are controlled in a direction to decrease, whereby the impedance $Z_0$ of the first field effect transistors Q5 and Q6 is controlled in a direction to increase. Consequently, the potential at the point J is controlled in a direction to rise, thus converging to the potential at the potential K.

In this manner, the first bias generator circuit 18 operates in a manner such that the output impedance $Z_0$ of the dummy circuit 10A converges into coincidence with the resistance of the load resistor R1, and delivers the bias voltages Bias-P and Bias-N which satisfy such condition. Accordingly, when the bias voltages such as Bias-P and Bias-N are supplied to the driver 10, the output impedance $Z_0$ of the driver 10 is controlled into coincidence with the resistance of the load resistor R1.

In the above description, it is assumed that R2=R3, but the values of R2 and R3 can be chosen as desired. In this instance, the impedance $Z_0$ when the potentials at points J and K in the bridge circuit 21 are balanced will be given as $Z_0$=R1×R3/R2, and accordingly, the values of R1, R2 and R3 may be determined so that the value of R1×R3/R2 coincides with the characteristic impedance of the signal transmission path LIN.

While a bridge circuit comprising resistors R1, R2, R3 and $Z_0$ is shown, the potential at the junction K between R2 and R3 only provides a reference potential which is used for comparison against the potential at the output J of the dummy circuit 10A. Accordingly, it will be apparent that a predetermined reference voltage may be applied to the inverting input terminal of the differential amplifier 22 rather than using R2 and R3.

The second bias generator circuit 19 may comprise a dummy circuit 10B, a differential amplifier 23 and an offset adder 26. The second bias generator circuit 19 operates in a manner such that an offset voltage equal to an offset voltage $V_{OFF}$ which is input to the offset voltage adder 26 is generated between the input terminal 11 and the output terminal 12 of the driver 10. Thus, a center voltage $V_C$ which is generated accurately and in a stable manner by a center voltage generator is also input to the input terminal 11B of the dummy circuit 10B, causing a center voltage $V_C'$ to be delivered at its output terminal. Here, a center voltage $V_C$ delivered from the dummy circuit 10B is represented by $V_C'$. The differential amplifier 23 operates to compare the center voltage $V_C'$ delivered from the dummy circuit 10B added with the offset voltage $V_{OFF}$ applied to the offset adder 26 or $V_C'+V_{OFF}$ against the center voltage $V_C$ which is generated in a stable manner by the center voltage generator.

When the offset voltage is chosen as $V_{OFF}$=0 volt, the second bias generator circuit 19 operates to converge to the condition $V_C=V_C'$. Accordingly, the offset potential at the output terminal 12 of the driver 10 will be the center voltage $V_C$, thus allowing a signal excitation about the center voltage $V_C$. Under this condition, the driver operates with a zero d.c. potential difference (or offset voltage) between the input terminal 11 and the output terminal 12, and the input signal is delivered to the signal transmission path LIN without the offset voltage being added thereto.

When the offset voltage $V_{OFF}$ is chosen to be +V, for example, the second bias generator circuit 19 will be stabilized when $V_C=V_C'+V$. Under this condition, the d.c. potential at the output terminal 12 of the driver 10 will be equal to $V_C-V$, and the input signal applied to the input terminal 11 will be excited about the level $V_C-V$ to be delivered onto the signal transmission path LIN.

When the offset voltage $V_{OFF}$ is chosen to be equal to $-V$, for example, the second bias generator circuit 19 will be stabilized when $V_C=V_C-V$. Under this condition, the d.c. potential at the output terminal 12 of the driver 10 will be equal to $V_C+V$, and the input signal applied to the input terminal 11 will be excited about the level $V_C+V$ to be delivered onto the signal transmission path LIN.

In the event the d.c. potential at the output terminal 12 of the driver 10 varies toward the supply voltage $V_{DD}$ as by temperature fluctuations or the like, for example, the potential at the output terminal L of the dummy circuit 10B which is constructed in the same manner as the driver circuit 10 will also be subject to the influence of similar temperature fluctuations to vary in the same direction. When the output voltage $V_C'$ from the dummy circuit 10B varies toward the supply voltage $V_{DD}$, the output voltage from the differential amplifier 23 also begins to vary in a direction to rise in the positive direction. Such a variation is directly transmitted into the bias voltages Bias-P and Bias-N, which then rise in the positive direction. As a consequence, the current $I_1$ passing through the field effect transistor Q3 (refer the driver 10) decreases while the current $I_2$ passing through the field transistor Q4 increases. As a consequence, the impedance of the field effect transistor Q5 is controlled in an increasing direction while the impedance of the field effect transistor Q6 is controlled in a decreasing direction, whereby the potentials at the output terminals 12 and L are controlled in a falling direction, allowing the potential difference between the input and the output of the driver 10 to converge to 0 volt if the offset voltage $V_{OFF}$ is chosen equal to 0.

In the event the d.c. potentials at the output terminals 12 and L of the driver 10 and the dummy circuit 10B vary in the falling direction, the bias voltages Bias-P and Bias-N both vary in the falling direction. such a variation is applied to the bias terminals 13 and 14, and 13B and 14B of the driver 10 and the dummy circuit 10B, whereby in the driver 10 and the dummy circuit 10B, the current $I_1$ passing through the field effect transistor Q3 is controlled in an increasing direction while the current $I_2$ passing through the field effect transistor Q4 is controlled in a decreasing direction. As a consequence, the impedance of the field effect transistor Q5 varies in a decreasing direction while the impedance of the field effect transistor Q6 varies in an increasing direction, causing the d.c. potentials at the output terminals 12 and L to rise. As a result, if the offset voltage $V_{OFF}$ is chosen equal to 0, the potential difference between input terminals of the differential amplifier 13 will now converge to a condition of 0 volt, in which it is normally maintained.

In this manner, when the second bias generator circuit 19 is used, arbitrarily chosen offset voltage $V_{OFF}$ may be applied across the input and the output of the driver 10, and the offset voltage $V_{OFF}$ chosen can be maintained constant independently from temperature fluctuations. However, when $V_{OFF}$ is chosen to be other than 0V, the output from the dummy circuit 10B will be $V_C'=V_C-V_{OFF}$. The output from the dummy circuit 10A which is based on the same bias voltages Bias-P, Bias-N will assume the same value $V_C'$ when no load, causing a deviation in the output impedance $Z_0$ of the dummy circuit 10A. Accordingly, an offset adder 27 may be connected to the line, as shown, on which the center voltage $V_C$ is transmitted within the first bias circuit 18, thus allowing the same offset voltage $V_{OFF}$ to be added.

Figure 4:
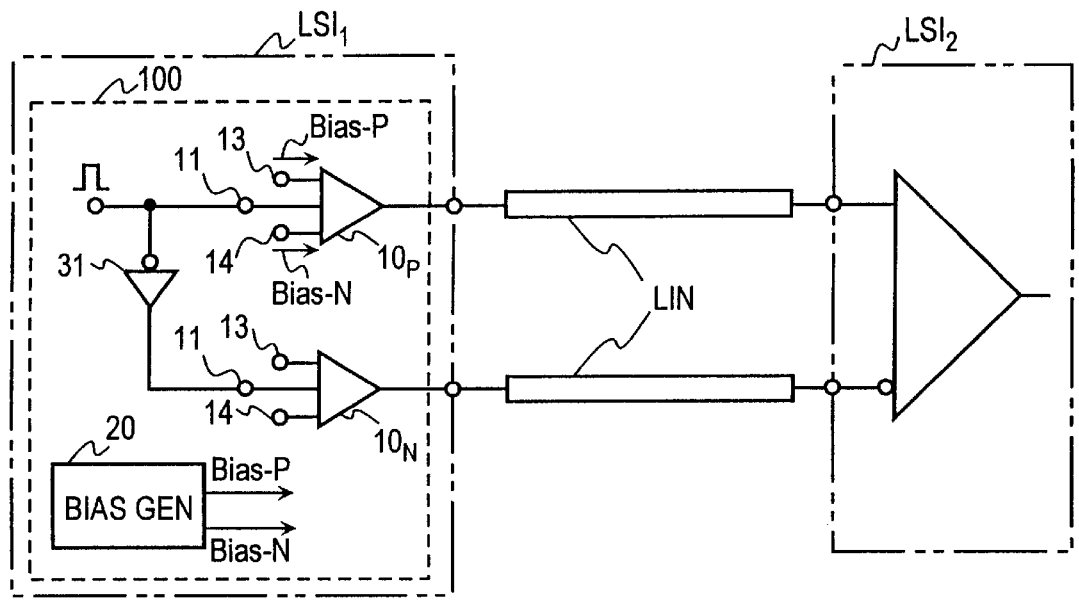
FIG. 4 is a block diagram illustrating a modification of the signal transmission method according to the embodiment of the invention.

Although the signal transmission path LIN is shown as an unbalanced transmission path in FIG. 1, the signal transmission method of the invention can be applied to a balanced signal transmission path as shown in FIG. 4. In this instance, an output drive circuit 100 includes a pair of drivers, one of which is operated as a positive sequence output driver 10P while the other is operated as a negative sequence output driver 10N by providing an inverter 31 at the input terminal of the other driver, with the input signal being input after its inversion. A bias generator 20 is shared by the both drivers.

Figure 5:
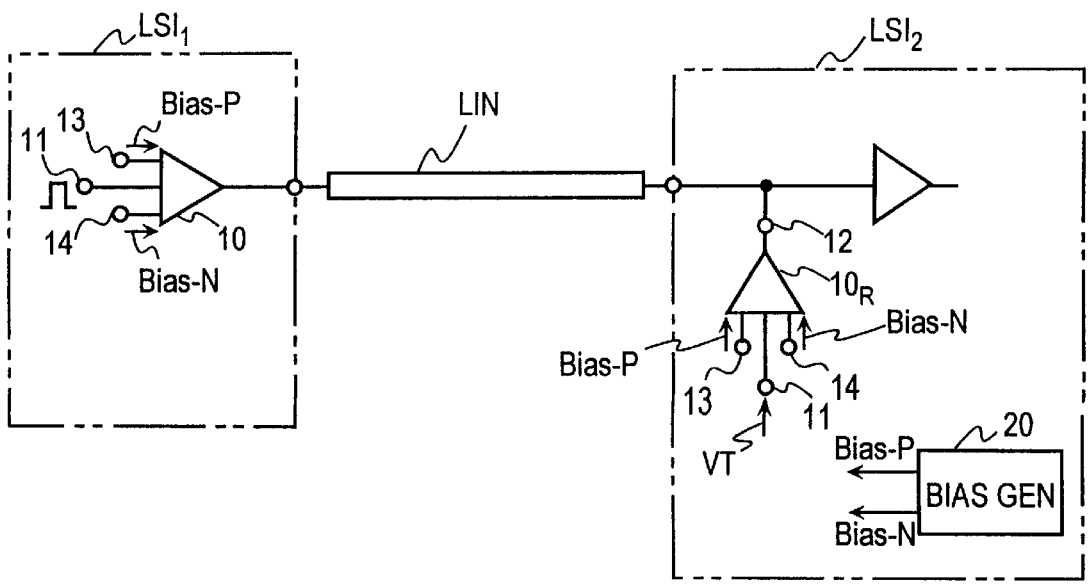
FIG. 5 is a block diagram of another modification.

As shown in FIG. 5, the output terminal 12 of the driver according to the invention may be connected to the receiving end so that a driver 10R may act as a termination resistor. Since the driver 10R is formed entirely by the field effect transistors, it may be formed within the integrated circuit without requiring an increased occupied area therefor. In this manner, such drivers 10R may be used in place of termination resistors at the receiving ends of a number of signal transmission paths LIN without accompanying any particular increase in the size of the semiconductor integrated circuits. A bias generator 20 may be used in common for all of the drivers 10R acting as the termination resistors within a common integrated circuit. When the driver 10 is used to act as termination resistor, the output impedance of the driver can be freely established electrically, affording an advantage that the output impedance can be brought exactly into coincidence with the characteristic impedance of the signal transmission path.

Figure 6:
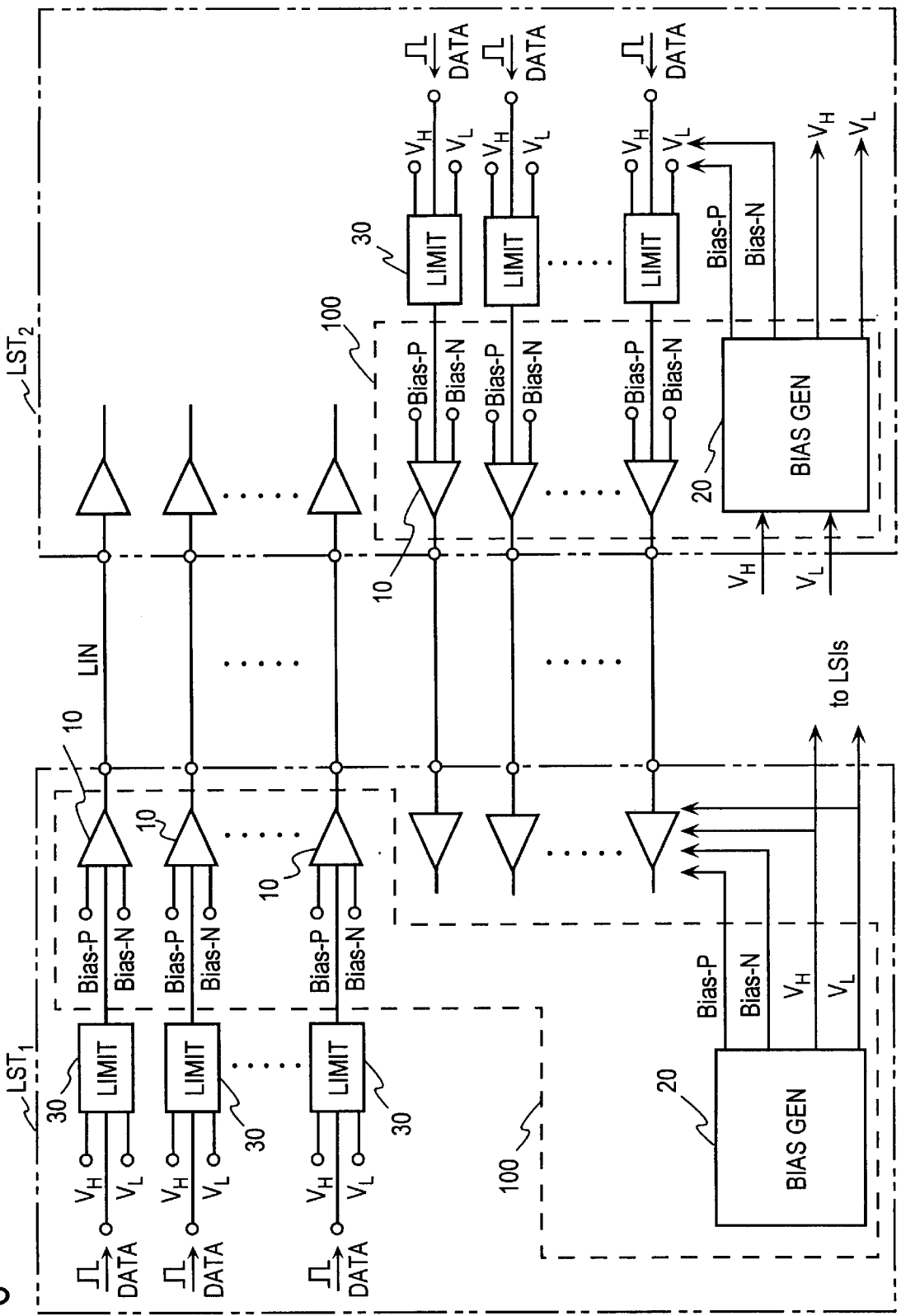
FIG. 6 is a block diagram illustrating a practical implementation of the drive circuit and the bias generator according to the invention.
Figure 7:
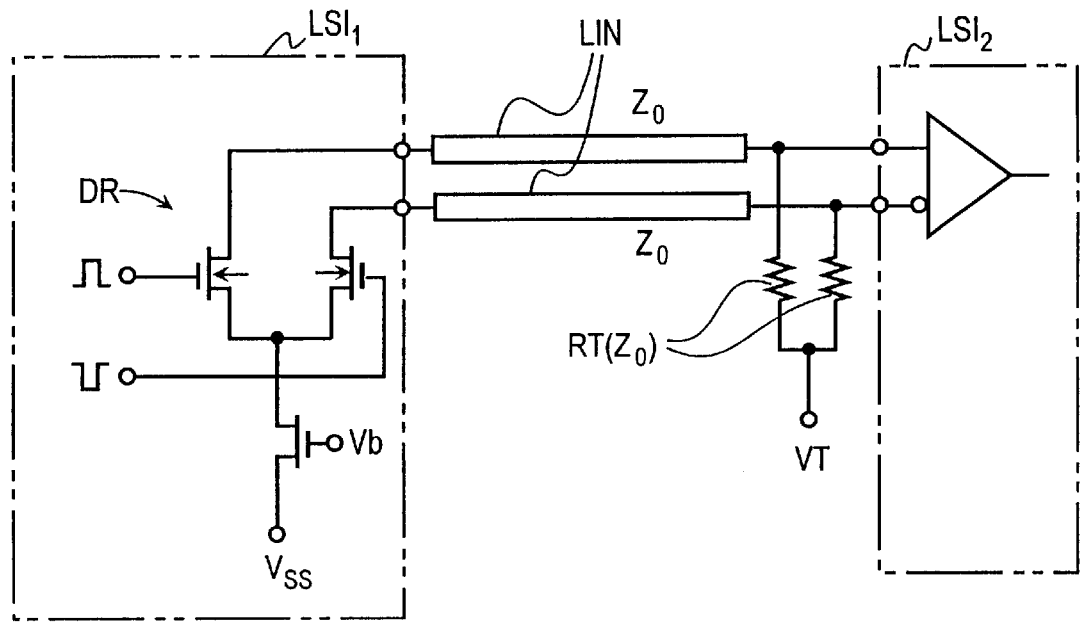
FIG. 7 is a block diagram illustrating a prior art.
Figure 8:
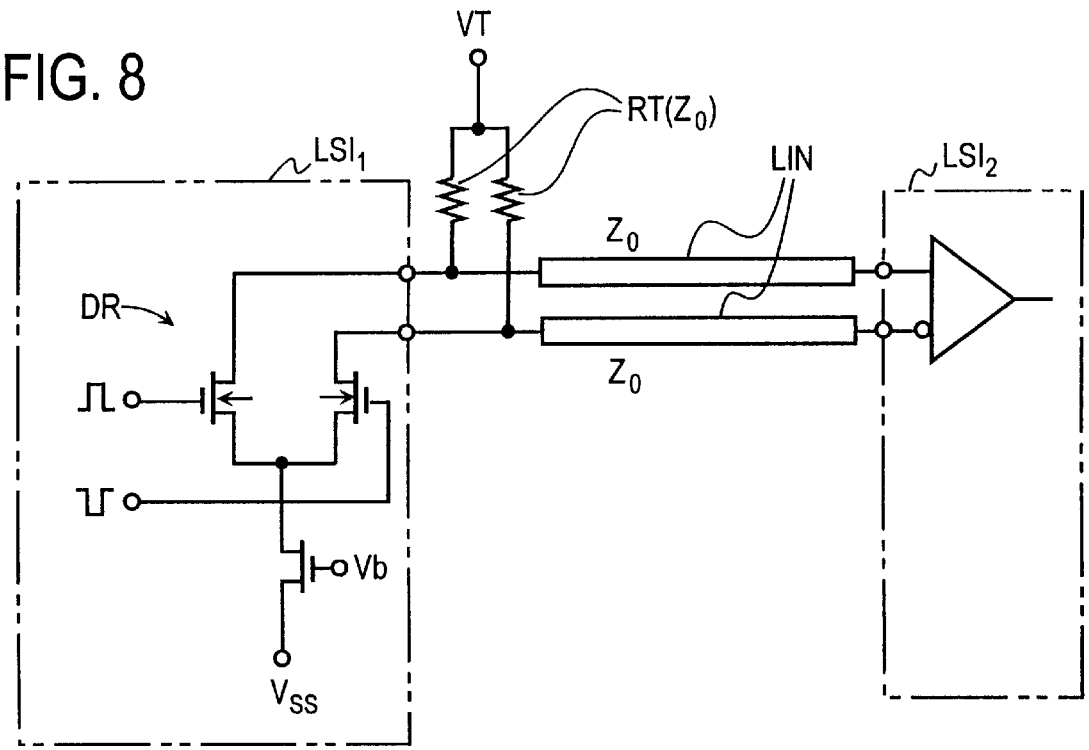
FIG. 8 is a block diagram illustrating another prior art.

FIG. 6 shows a practical implementation in which an output drive circuit 100 according to the invention is used for an impedance matching for a plurality of signal transmission paths LIN which connect between integrated circuits in common. Such semiconductor integrated elements are indicated at $LSI_1$ and $LSI_2$. To enable a signal transmission and reception between the semiconductor integrated circuit $LSI_1$ and $LSI_2$, a plurality of drivers 10 are disposed in the both semiconductor integrated circuits $LSI_1$ and $LSI_2$, each driver 10 delivering a signal onto a corresponding signal transmission path LIN.

The output drive circuit 100 in each of the semiconductor integrated circuits $LSI_1$ and $LSI_2$ is provided with a bias generator 20, which generates bias voltages Bias-P and Bias-N separately for each of the semiconductor integrated circuits $LSI_1$ and $LSI_2$, thus supplying the bias voltages, Bias-P and Bias-N, to the drivers 10 within each circuit.

In this example, there is provided an amplitude limiter circuit 30 which precedes each driver in order to limit the amplitude of the transmitted signal to a range between the voltages $V_H$ and $V_L$. In the arrangement shown, the amplitude limiter circuit 30 limits the amplitude of a signal which is input to the driver 10 to a smaller amplitude on the order of several hundreds of mV to 1V, which is then transmitted onto the signal transmission path LIN, thus reducing the magnitude of distortion in the waveform which may be caused by the capacitances which are distributed throughout the signal transmission path LIN.

EFFECTS OF THE INVENTION

As discussed above, the signal transmission method according to the invention eliminates the need for the provision of a termination resistor at either transmitting or receiving end of the signal transmission path LIN, and avoids the need for an area on which the termination resistor is to be mounted. This provides an advantage that an entire device can be formed in a compact arrangement even when a signal of a high frequency is to be transmitted and received between the integrated circuits by virtue of the elimination of space which would be otherwise required for the connection of a termination resistor to either an input and/or output terminal of a semiconductor integrated terminal element. In an embodiment in which a desired offset voltage is added to a signal which is delivered at the output terminal 12 of the driver, there is obtained an advantage that an offset voltage which permits a reception in the normal manner on the receiving side can be added upon delivery if there is a difference in the supply voltage between the transmitting and the receiving side.

What is claimed is:

1. An output drive circuit mounted within a semiconductor integrated circuit for providing a connection between semiconductor integrated circuits, said output drive circuit comprising a bias generator for generating a first and a second bias voltage and a first driver, the first driver including:
   a pair of first field effect transistors of opposite conductivity types having sources connected together at a junction leading to an output terminal and operating as source followers which operate in a push-pull mode,
   a pair of second field effect transistors of opposite conductivity types having sources connected to gates of the first field effect transistors, respectively, and having gates connected together and connected to a signal input terminal and operating as source followers which drive the gates of the first field effect transistors,
   a pair of third field effect transistors of opposite conductivity types operating as current sources which feed current to the sources of the second field effect transistors, the current being controlled in accordance with a bias voltage applied to each gate of the third field effect transistors to thereby control an impedance as seen from the output terminal and an offset voltage at the output terminal,
   and a pair of bias terminals connected to the gates of the pair of third field effect transistors and connected to the bias generator to receive the first and the send bias voltage from the bias generator.

2. An output drive circuit according to claim 1, wherein the bias generator includes
   a second driver as an impedance controlling dummy circuit having substantially the same structure as the first driver and an input terminal to which a first reference potential is applied,
   a load resistor connected in series with the output of the impedance controlling dummy circuit between the output terminal thereof and a terminal that is connected to a supply voltage,
   an impedance controlling differential amplifier for detecting a potential difference between potential at the output terminal of the impedance controlling dummy circuit and a second reference potential,
   circuitry connected to an output of the impedance controlling differential amplifier for forming in response to the detected potential difference a reverse polarity voltage and a positive polarity voltage which are applied to the pair of bias terminals of the first driver as the first and the second bias voltage,
   and an impedance controlling feedback circuit for feeding the reverse polarity voltage and the positive polarity voltage formed from the detected potential difference to one and the other of the pair of bias terminals of the impedance controlling dummy circuit as the first and the second bias voltage, wherein the detected potential difference is controlled to approach a level of zero to thereby control the output impedance of the impedance controlling dummy circuit.

3. An output drive circuit according to claim 1, wherein the bias generator includes
   a second driver as an offset controlling dummy circuit having substantially the same structure as the first driver and an input terminal to which a first reference potential is applied,
   an offset controlling differential amplifier for detecting a potential difference between the potential at the output terminal of the offset controlling dummy circuit and the first reference potential, the detected potential difference being applied to the pair of bias terminals of the first driver as the first and the second bias voltage,
   and an offset controlling feedback circuit for feeding the detected potential difference from the offset controlling differential amplifier to the pair of bias terminals of the impedance controlling dummy circuit, where the detected potential difference is controlled to approach a level of zero.

4. An output drive circuit according to claim 3 further including an offset adder for adding an offset voltage to the output from the offset controlling dummy circuit, the added result being input, as the output of the offset controlling dummy circuit, to the offset controlling differential amplifier.

5. An output drive circuit according to claim 1, wherein the bias generator includes
   a second driver as an impedance controlling dummy circuit having substantially the same structure as the first driver and an input terminal to which a first reference potential is applied,
   a load resistor connected in series with the output of the impedance controlling dummy circuit between the output terminal thereof and a terminal that is connected to a supply voltage,
   an impedance controlling differential amplifier for detecting a potential differences between the potentail at the output terminal of the impedenance controlling dummy circuit and a second reference potential,
   a third driver as an offset controlling dummy circuit having substantially the same structure an the first driver and an input terminal to which the predetermined first reference potential is applied,
   an offset controlling differential amplifier for detecting a potential difference between the potential at the output terminal of the offset controlling dummy circuit and the first reference potential,
   a subtractor circuit for subtracting the output from the impedance controlling amplifier from the output of the offset controlling amplifier, with a result of subtraction being fed to one of the pair of bias terminals of the first driver as the first bias voltage,
   an adder circuit for adding the output from the impedance controlling amplifier to the output of the offset controlling amplifier, with a result of addition being fed to the other of the pair of bias terminals of the first driver as the second bias voltage,
   and a first and a second feedback circuit for feeding the result of subtraction and the result of addition to one and the other of the pair of bias terminals of the impedance controlling dummy circuit and the offset controlling dummy circuit, respectively, thereby controlling the impedance controlling differential amplifier and the offset controlling differential amplifier so that their outputs approach levels of zero.

6. An output drive circuit according to claim 2 or 5 further including a first and a second voltage dividing resistor connected in series between the terminal connected to the supply voltage and a third reference potential, the potential at the junction between the first and the second voltage dividing resistor providing the second reference potential.

7. An output drive circuit according to claim 6 in which the first and the second voltage dividing resistors have equal resistances, whereby the first reference potential and the third reference potential are equal to each other.

8. An output drive circuit according to claim 6, further including a first offset adder for adding a first offset voltage to the output of the offset controlling dummy circuit, with a result of addition being input as the output from the offset controlling dummy circuit to the offset controlling differential amplifier, and a second offset adder connected in series between the second voltage dividing resistor and the third referential potential for adding a second offset voltage to the third referential potential, with a result of addition being applied to the second voltage dividing resistor.

9. An output drive circuit according to one of claims 1, 5, 6 or 8 that includes another driver having substantially the same structure as the first driver, wherein the input signal is applied as a positive sequence to the first driver and as a negative sequence to said another driver.

10. An output circuit according to one of claims 1, 2, 3, or 5, wherein the first and the second bias voltage from the bias generator is applied to the pair of bias terminals of each driver.

11. An apparatus comprising a first driver circuit, said first driver circuit having:
   a first field effect transistor of a first conductivity type and having a first gate coupled to an input terminal, a first drain coupled to a first supply-voltage terminal and a first source;
   a second field effect transistor of a second conductivity type that is opposite of said first conductivity type and having a second gate coupled to said input terminal, a second drain coupled to a second supply-voltage terminal, and a second source;
   a third field effect transistor of said first conductivity type and having a third gate coupled to a first bias-voltage terminal, a third drain coupled to said first source, and a third source coupled to said second supply-voltage terminal;
   a fourth field effect transistor of said second conductivity type and having a fourth gate coupled to a second bias-voltage terminal, a fourth drain coupled to said second source, and a fourth source coupled to said first supply-voltage terminal;
   a fifth field effect transistor of said second conductivity type and having a fifth gate coupled to said first source, a fifth drain coupled to said second supply-voltage terminal, and a fifth source coupled to an output terminal; and
   a sixth field effect transistor of said fist conductivity type and having a sixth gate coupled to said second source, a sixth drain coupled to said first supply-voltage terminal, and a sixth source coupled to said output terminal.

12. An apparatus according to claim 11 implemented as a semiconductor integrated circuit and including a bias-voltage generator circuit coupled to a first voltage reference and having a first bias-voltage output and a second bias-voltage output, wherein said first bias-voltage output is coupled to the first bias-voltage terminal of said first driver circuit and said second bias-voltage output is coupled to the second bias-voltage terminal of said first driver circuit.

13. An apparatus according to claim 12, wherein said bias-voltage generator comprises:
   a second driver circuit, having substantially the same structure as said first driver circuit, in which said input terminal is coupled to said first voltage reference;
   a first resistor coupled between a third supply-voltage terminal and said output terminal of said second driver circuit;
   a first differential amplifier having an output, having a first input coupled to said output of said second driver circuit, and having a second input coupled to a second voltage reference;
   a first feedback circuit coupled between said first differential amplifier output and said first bias-voltage terminal of said first and second driver circuits; and
   a second feedback circuit coupled between said first differential amplifier output and said second bias-voltage terminal of said first and second driver circuits, wherein a signal fed back by said second feedback circuit is inverted with respect to a signal fed back by said first feedback circuit.

14. An apparatus according to claim 12, wherein said bias-voltage generator includes:
   a third driver circuit, having substantially the same structure as said first driver circuit, in which said input terminal is coupled to said first voltage reference;
   a second differential amplifier having an output, having a first input coupled to said output terminal of said third driver circuit and having a second input coupled to said input terminal of said third driver circuit;
   a third feedback circuit coupled between said second differential amplifier output and said first bias-voltage terminal of said first and third driver circuits; and
   a fourth feedback circuit coupled between said second differential amplifier output and said second bias-voltage terminal of said first and third driver circuits.

15. An apparatus according to claim 14 further comprising an adding circuit interposed between said output terminal of said third driver circuit and said second differential amplifier first input, wherein said adding circuit has a first input coupled to said output terminal of said third driver circuit, has a second input coupled to an offset voltage reference, and has an output coupled to said second differential amplifier first input.

16. An apparatus according to claim 14 wherein said bias-voltage generator comprises:
   a second driver circuit, having substantially the same structure as said first driver circuit, in which said input terminal is coupled to said first voltage reference;
   a first resistor coupled between a third supply-voltage terminal and said output terminal of said second driver circuit;
   a first differential amplifier having an output, having a first input coupled to said output terminal of said second driver circuit, and having a second input coupled to a second voltage reference;
   a subtracting circuit interposed between said second differential amplifier output and said first bias-voltage terminal of said first and third driver circuits, said subtracting circuit having a first input coupled to said first differential amplifier output, having a second input coupled to said second differential amplifier output, and having an output coupled to said first bias-voltage terminal of said first, second and third driver circuits; and a first adding circuit interposed between said second differential amplifier output and said second bias-voltage terminal of said first and third driver circuits, said first adding circuit having a first input coupled to said first differential amplifier output, having a second input coupled to said second differential amplifier output, and having an output coupled to said second bias-voltage terminal of said first, second and third driver circuits.

17. An apparatus according to claim 13 or 16 further comprising a second resistor coupled to said third supply-voltage terminal and a third resistor coupled between said second resistor and a fourth supply-voltage terminal, wherein said second and third resistors form a voltage divider between said third and fourth supply-voltage terminals that provides said second voltage reference.

18. An apparatus according to claim 17 wherein said second resistor and said third resistor have respective resistances that are equal.

19. An apparatus according to claim 17 further comprising:

a second adding circuit interposed between said third resistor and said fourth supply-voltage terminal, wherein said second adding circuit has a first input coupled to said fourth supply-voltage terminal, has a second input coupled to an offset voltage reference, and has an output coupled to said third resistor; and a third adding circuit interposed between said output terminal of said third driver circuit and said second differential amplifier first input, wherein said third adding circuit has a first input coupled to said output terminal of said third driver circuit, has a second input coupled to said offset voltage reference, and has an output coupled to said second differential amplifier first input.

20. An apparatus according to one of claims 12, 13, 14 or 16, wherein the first bias-voltage terminals for each of said driver circuits are coupled together and the second bias-voltage terminals for each of said driver circuits are coupled together.

21. An apparatus according to claim 20 further comprising a fourth driver circuit and a fifth driver circuit coupled to receive a common input signal, wherein said fifth driver circuit comprises an inverter such that, in response to the common input signal, said fourth and fifth driver circuits have outputs that are inverted with respect to each other.

* * * * *